(12) United States Patent
Bienek (10) Patent No.: US 6,867,613 B1
(45) Date of Patent: Mar. 15, 2005

(54) BUILT-IN SELF TIMING TEST METHOD AND APPARATUS

(75) Inventor: Michael D. Bienek, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/886,341

(22) Filed: Jul. 7, 2004

(51) Int. Cl.$^7$ .............................................. G01R 31/26
(52) U.S. Cl. ..................... 324/765; 324/763; 324/769
(58) Field of Search ................ 324/763, 765, 324/769, 158.1, 73.1; 331/45, 57; 327/182; 714/724, 733–734

(56) References Cited

U.S. PATENT DOCUMENTS

| | | | | |
|---|---|---|---|---|
| 5,329,254 A | * | 7/1994 | Takano | .......................... 331/34 |
| 6,759,911 B2 | * | 7/2004 | Gomm et al. | .................. 331/10 |
| 6,760,873 B1 | | 7/2004 | Hao et al. | |
| 6,782,498 B2 | | 8/2004 | Tanizaki et al. | |
| 6,798,230 B1 | * | 9/2004 | Taylor et al. | ................ 324/763 |

OTHER PUBLICATIONS

"Elimination of Traditional Functional Testing of Interface Timings at Intel", Tripp, et al. ITC International Test Conference, *IEEE*, Paper 39.2, week of Sep. 29–Oct. 2, 2003, 0–7803–8106–8/03.

* cited by examiner

Primary Examiner—Minh N. Tang
(74) Attorney, Agent, or Firm—Meyertons Hood Kivlin Kowert & Goetzel, P.C.; B. Noël Kivlin; Erik A. Heter (57) ABSTRACT

A method and apparatus for conducting built-in self-timing tests. In one embodiment, a method for conducting timing tests includes selecting one or more I/O pairs (each I/O pair including a driver and a receiver) into a loop of a ring oscillator, the ring oscillator including an odd number of inverters. The ring oscillator is coupled to a measurement circuit configured to measure delay time in the loop. After initiating operation of the ring oscillator, the delay time through the loop can be measured. Selection circuits may be used to selectively enable or bypass individual I/O pairs in the loop of the ring oscillator. This selective bypassing may allow timing measurements for individual I/O pairs.

28 Claims, 6 Drawing Sheets

BUILT-IN SELF TIMING TEST METHOD AND APPARATUS

BACKGROUND OF THE INVENTION

1. Field of the Invention

This invention relates to integrated circuits, and more particularly, to the testing of integrated circuits.

2. Description of the Related Art

Integrated circuit (IC) technology has made rapid advances in recent years. One area where IC technology has noticeably improved is in operational speed. Processor speeds of over 2 GHz are commonplace nowadays, and bus speeds are approaching 1 GHz. While these advances result in considerably greater performance, they also create problems. One such problem involves the testing of these IC's.

While some internal functionality of a high-speed integrated circuit can be tested at full speed (due to clocking by internal phase locked loops), it is often times difficult (if not impossible) to conduct any kind of test of the IC's input/output (I/O) pins at full operational speed. Timing tests are one type of test that is critical for ensuring proper operation of the I/O's of an IC. In such timing tests, it is often times necessary to determine the response time to data input to or output from the various I/O pins on the IC.

Timing tests for an IC may often times be conducted on automated test equipment (ATE). However, using ATE to conduct accurate timing tests is often times problematic, particularly with the higher operational speeds of newer generations of IC's. As bus speeds (and thus the speeds at which I/O's operate) have increased with newer generations of IC's, ATE capabilities have not increased proportionally. Thus, newer ATE often times lacks the accuracy necessary for ensuring proper timing tests. This lack of accuracy may sometimes be compensated for using special tester setups, but these setups may not be conducive to high volume manufacturing.

Regardless of any special setups, the lack of accuracy of ATE relative to the operational speeds may result in tradeoffs between the conducting of timing tests with wide margins (resulting in a higher product yield at the risk of sacrificing quality) or with narrow margins (resulting in a lower yield and the possibility of good product being scrapped). Alternatively, an IC manufacturer could choose to wait until a new generation of ATE is introduced having the requisite accuracy, but this would result in an unacceptable time-to-market for the manufacturer and put them at a significant competitive disadvantage. This is compounded by the fact that ATE represents a large capital investment, and thus adds significantly to the cost of a product. With the operational speed of IC's (including the I/O speed) advancing rapidly, IC manufacturers may be forced to purchase new ATE with each new product generation in order to ensure product quality and functionality, resulting in a more expensive finished product in a competitive market.

SUMMARY OF THE INVENTION

A method and apparatus for conducting built-in self-timing tests is disclosed. In one embodiment, a method for conducting timing tests includes configuring and selecting one or more I/O pairs (each I/O pair including a driver and a receiver) into a loop of a ring oscillator, the ring oscillator including an odd number of inverters. The ring oscillator is coupled to a measurement circuit configured to measure delay time in the loop. After initiating operation of the ring oscillator, the delay time through the loop can be measured.

In one embodiment, an integrated circuit includes one or more ring oscillators that can be used for conducting built-in self-timing tests. Each ring oscillator includes an odd number of inverters, and may include as few as one inverter. A loop in the ring oscillator may be formed by selection circuits. Each selection circuit is associated with an I/O pair, the I/O pair including a driver and a receiver. For each I/O pair, its associated selection circuit may be configured to either cause the I/O pair to be included in the loop of the ring oscillator or bypassed by the loop of the ring oscillator. When an I/O pair is included in the loop of the ring oscillator, a pulse passing through the loop will propagate through both the driver and the receiver of the I/O pair. Thus, each of the plurality of selection circuits may be used to reconfigure the loop of the ring oscillator for performing timing tests, including as many or as few I/O pairs in the loop as desired for each particular test conducted.

As previously noted, a measurement circuit is coupled to the loop of the ring oscillator. In one embodiment, the measurement circuit may be implemented as a counter. Timing measurements may be performed by determining a number of pulses received by the counter in a predetermined time interval. The counter may be configured to increment on a rising edge, a falling edge, or both. Dividing the predetermined time interval by the number of received pulses may yield an average delay time through each of the I/O pairs. Delay time through individual I/O pairs may be more accurately determined by comparing the average delay time when the loop includes all of the I/O pairs in the loop to the average delay time when the loop is configured to bypass the individual I/O pair that is to be measured. The difference between the delay time with all of the I/O pairs in the loop and the delay time with the individual I/O pair bypassed by the loop may yield the delay time for the individual I/O pair.

The method and apparatus may be performed using ATE. However, an integrated circuit implementing the built-in self-timing test does not require that the ATE perform at the operational speed of the IC itself. Thus, new generations of integrated circuits incorporating the method and apparatus may be introduced without requiring the purchase of new testers. In addition, the method may be process independent. That is, the method may be such that it is independent of variations in the IC manufacturing process which may in turn eliminate the need for any calibration routines prior to performance of the BISTT.

BRIEF DESCRIPTION OF THE DRAWINGS

Other aspects of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Figure 1:
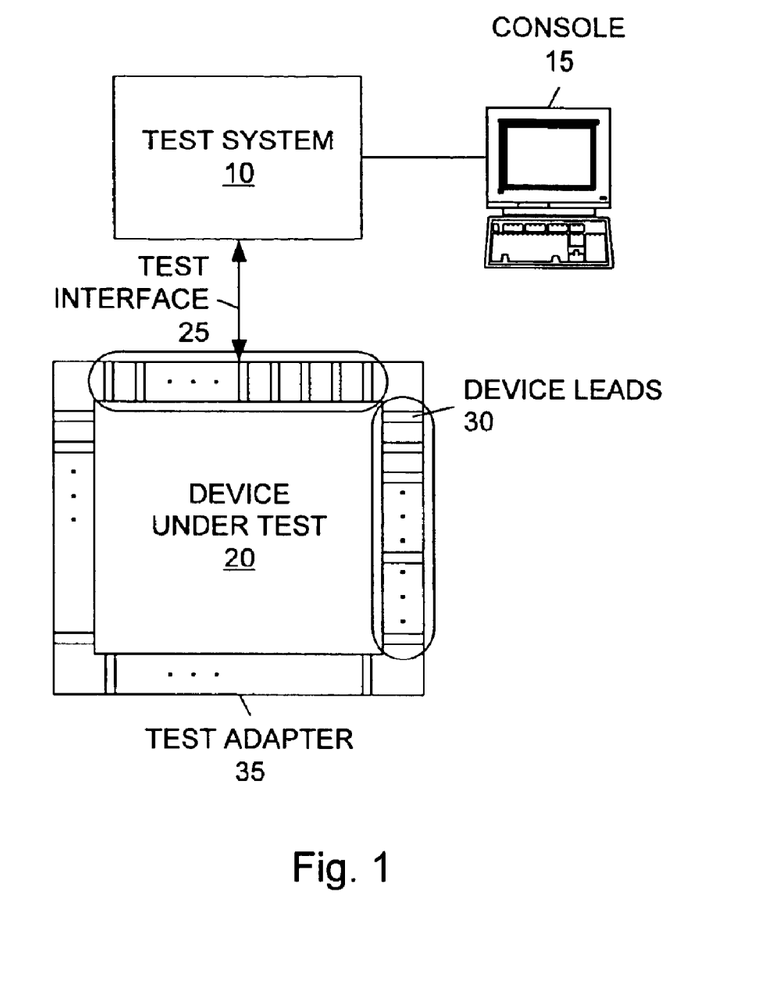
FIG. 1 is a drawing of one embodiment of a test system and a device under test (DUT)

Turning now to FIG. 1, a drawing of one embodiment of a test system and a device under test is shown. Test system 10 is coupled to device under test (DUT) 20 through test interface 25 and test adapter 35. A user console 15 is also coupled to test system 10.

Test adapter 35 may be a specialized test socket, which is designed specifically for DUT 20 or may be a general-purpose test socket. Test adapter 35 is typically used to provide connections from circuit tester 10 for signals such as test clock signals as well as various input and output signals to each of the device leads 30 on DUT 20.

In the embodiment shown, test system 10 is a complex computerized test system which may contain one or more processor, banks of random access memory (RAM), read only memory (ROM) and mass storage devices such as hard disk drives. Test system 10 may be programmed through user console 15 to run test programs written in any suitable programming language.

A test program is typically used for communications between test system 10 and DUT 20. The test program may include instructions that, when executed, pre-condition DUT 20. The code may vary such device parameters as the input voltage and input clock frequency. To communicate with DUT 20, tester files commonly referred to as test patterns are used. The inputs and outputs of DUT 20 are typically stimulated and monitored using values in the test patterns. The values in the test patterns are represented by test vectors, which may direct test system 10 as to when to apply specific stimuli to the inputs of DUT 20 and when to monitor the outputs from DUT 20. Thus, execution of the test program may pre-condition DUT 20 and then call a particular test pattern. As DUT 20 is pre-conditioned, its inputs may be stimulated while its outputs are monitored and compared against expected values. As used herein, a test vector is a value or a group of values that may be used to as stimulus to DUT 20. Test vectors may cause DUT 20 to operate in various modes.

In addition to the tests preformed by test system 10, DUT 20 may also be subject to certain built-in self-test (BIST) routines. Such BIST routines may be necessary in cases where the maximum clock frequency at which test system 10 may operate is much lower than the required clock frequency for a given test. However, test system 10 may still be configured to send signals to DUT 20 to invoke BIST routines that may be performed. Test system 10 may also be configured to receive test output data generated by a BIST routine from DUT 20. The test output data may include various types, including pass/fail data as well as parametric data.

One type of BIST routine that may be invoked by tester 10 is a built-in self-timing test (BISTT) for verifying the timing of inputs/outputs (I/O's). In many cases, the operating clock speed for DUT 20 will be greater than the maximum clock speed at which test system 10 can operate. Thus, the use of a BISTT for I/O pins may be required in order to perform timing verification. Test system 10 may send one or more signals to invoke a BISTT routine in DUT 20. After the BISTT routine has been performed, DUT 20 may provide data concerning I/O timing measurements (and pass/fail information, if available) to test system 10.

Figure 2:
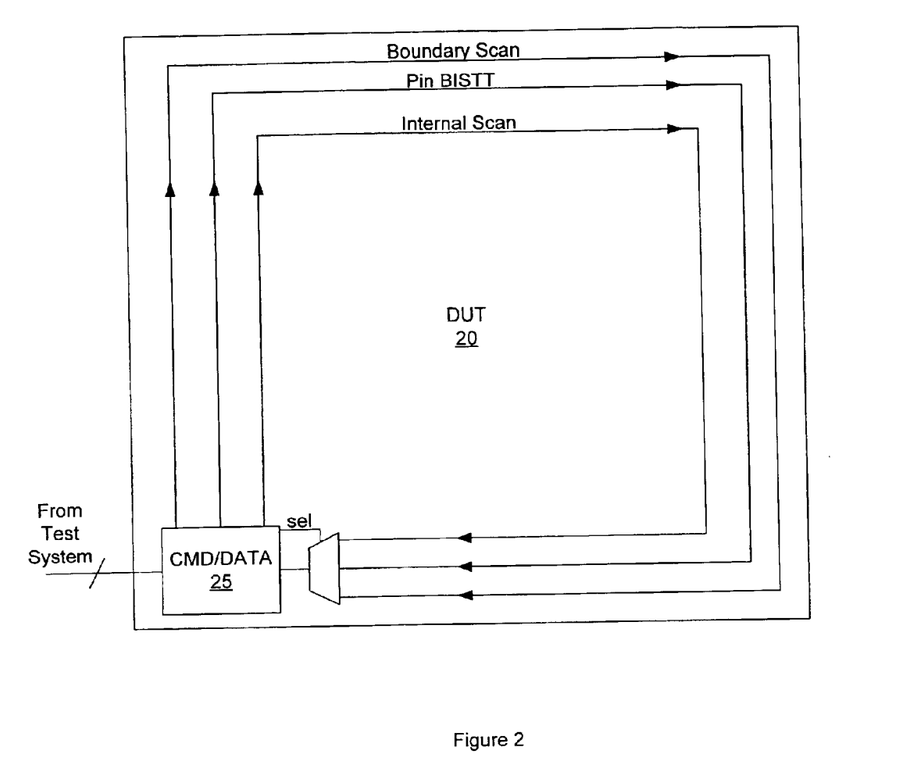
FIG. 2 is a drawing of one embodiment of a DUT.

Moving now to FIG. 2, a drawing of one embodiment of a DUT is shown. DUT 20 may be similar to the DUT shown in FIG. 1. In the embodiment shown, DUT 20 includes at least one boundary scan chain, at least one internal scan chain, and at least one ring oscillator for conducting I/O pin BISTT. Embodiments with a greater number of boundary scan chains and/or internal scan chains (or none) are also possible and contemplated.

DUT 20 also includes command/data unit 25. Command/data unit 25 is coupled to receive one or more signal inputs from a test system (e.g. test system 10 discussed above). These signals may include signals for invoking self-test routines such as the BISTT. Command/data unit 25 may also be coupled to various elements in the pin BISTT ring oscillator, and may receive data from these elements (e.g., counters) in order to obtain timing data. This data may then be provided from command/data unit 25 to the test system.

Figure 3:
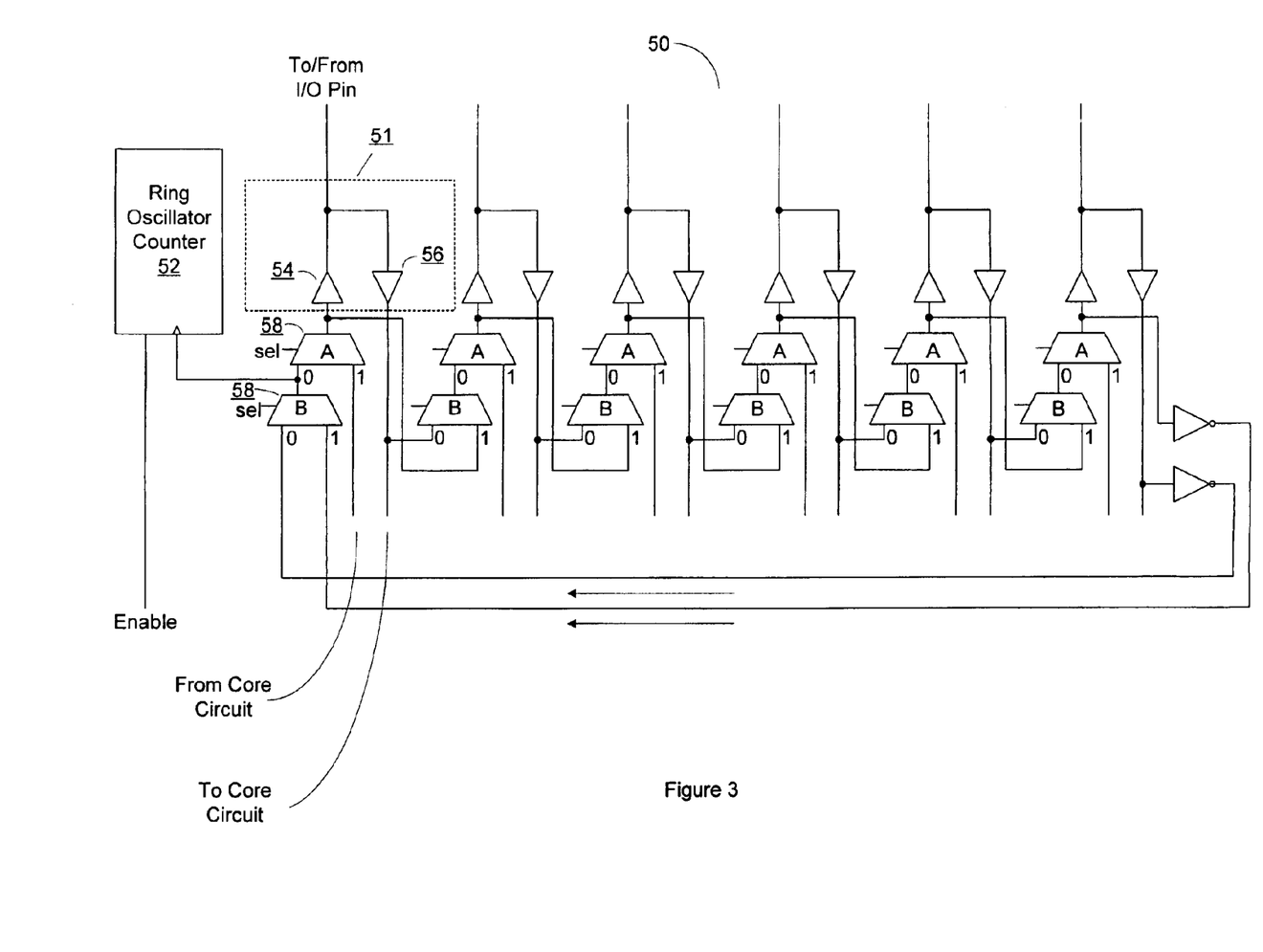
FIG. 3 is a drawing of one embodiment of a ring oscillator formed with I/O cells and used for I/O timing tests.

FIG. 3 is a drawing of one embodiment of a ring oscillator formed with I/O cells and used for I/O timing tests. In the embodiment shown, ring oscillator 50 may be one of one or more ring oscillators implemented in DUT 20. Each ring oscillator is implemented by the coupling of a plurality of I/O pairs 51. Each I/O pair 51 includes a driver 54 and a receiver 56. During normal operation of the integrated circuit (IC) of DUT 20, signals driven from the IC are conveyed to an external pin by driver 54. Similarly, signals conveyed IC from the external world through a signal pin are received by a receiver 56 associated with the pin. Since the pair is configured for both inputting and outputting signals, the output of driver 54 and the input of receiver 56 share a common node.

For each I/O pair 51, ring oscillator 50 includes an associated pair of selection circuits 58 (e.g., multiplexers). Each pair of selection circuits includes a first selection circuit ('A') and a second selection circuit ('B'). Each driver 54 is coupled to receive a signal via an output of a first selection circuit 58. The selection circuit 58-A in this embodiment includes two inputs. One of the inputs ('1') of selection circuit 58-A is coupled to receive a signal from the core of the integrated circuit with which each I/O pair 51 is associated. The other input ('0') is coupled to receive a signal output by selection circuit 58-B. Thus, during normal operations of an integrated circuit in which the I/O pairs 51 are implemented, each driver 54 may receive signals through input 1 of its associated selection circuit 58-A. During the performance of a BISTT routine, each driver 54 may receive signals through input 0 of its associated selection circuit 58-A, which are provided from the output of it associated selection circuit 58-B. The 'B' selection circuits of each pair may be used to selectively enable or disable individual I/O pairs during the performance of a BISTT routine, as will now be explained in further detail.

In this particular embodiment, each 'A' selection circuit of ring oscillator 50 is set to a logic 0 during a BISTT routine, thereby allowing an output signal provided by its associated 'B' selection circuit to propagate through. For example, the left-most 'A' selection circuit shown in the drawing, when enabled for a BISTT routine, is set to select the output of the left-most 'B' selection circuit to propagate through. Thus, pulses propagating through the 'B' selection circuit will also propagate through the associated 'A' selection circuit.

Enablement of a particular I/O pair 51 for a BISTT routine is determined by the state of a selection signal received the next 'B' selection circuit in the chain. Thus, the first (i.e. left-most in this particular example) I/O pair 51 is enabled for a BISTT routine when the next 'B' selection circuit in the chain is set to allow an output from its receiver 56 to propagate through. In this embodiment, providing a logic 0 to the next selection circuit in the chain results in enablement of the first I/O pair 51. Since each 'A' selection circuit is set to select the output from its associated 'B' selection circuit, a signal provided by the preceding receiver 56 will propagate through both selection circuits to the input of the driver 54 of the next I/O pair.

In order to disable a particular I/O pair 51 from a BISTT routine, the next 'B' selection circuit may be set to allow the output provided by the preceding 'A' selection circuit to propagate through. Using the example of FIG. 3, the first I/O pair 51 may be disabled for a running of a BISTT routine by setting the next (i.e. second from left in the drawing) 'B' selection circuit to allow the output from the preceding 'A' selection circuit to propagate through. This is accomplished in this embodiment by placing a logic 1 on the selection input of the 'B' selection circuit. When this occurs, the preceding I/O pair 51 is effectively disabled from the BISTT, as the output from its receiver 56 is unable to propagate through the next 'B' selection circuit.

In summary, an I/O pair is enabled when a signal is able to propagate through its driver 54 and its receiver 56, through the both the next 'B' and 'A' selection circuits in the chain to the input of the next driver 54. Examples illustrating the enabling and disabling of I/O pairs in an embodiment of ring oscillator 50 will be discussed below in reference to FIGS. 4 and 5.

In the embodiment shown the output of one of the selection circuits 58-B (shown here as the left-most one in the drawing) is coupled to ring oscillator counter 52. Ring oscillator counter 52 may be incremented by pulses propagating through the coupled selection circuit. In one embodiment, each positive-going transition (rising edge) propagating through the coupled selection circuit 58-B will cause ring oscillator counter 52 to be incremented (when enabled by an enable signal). Embodiments wherein the ring oscillator counter 52 increments on the falling edge or on both the rising and falling edges are also possible and contemplated. The average amount of delay through the entire chain of enabled I/O pairs for a given BISTT cycle may be determined by dividing the duration of the BISST cycle (i.e. a predetermined time interval) by the number of pulses counted by ring oscillator counter 52. For, example, if a predetermined time interval is 100 nanoseconds, and the ring oscillator is incremented 10 times during this then the average delay through each of the enabled I/O pairs 51 is 100 ns/10 pulses=10 ns/pulse. The average time for all individual enabled I/O pairs may then be calculated by dividing the average time for all I/O pairs (e.g., 10 ns in the example just given) by the number of enabled I/O pairs for that particular BISTT run. Since there are 2 pulses (clock edges) that must circulate through the ring for each counter, the average I/O delay is 5 ns.

Delay time may also be measured for individual I/O pairs by conducting multiple BISTT runs. In a first BISTT run for a ring oscillator having N I/O pairs, each of the N I/O pairs of the ring oscillator may be enabled. A second BISTT run may be conducted with N−1 I/O pairs enabled, wherein the I/O pair of interest is disabled for the run. The average delay time measured from the second run may be subtracted from the average delay time measured from the first run in order to determine the delay time through the I/O pair of interest. This may yield a more accurate reading of the delay through a given I/O pair as opposed to merely calculating the average delay time discussed above.

Figure 4:
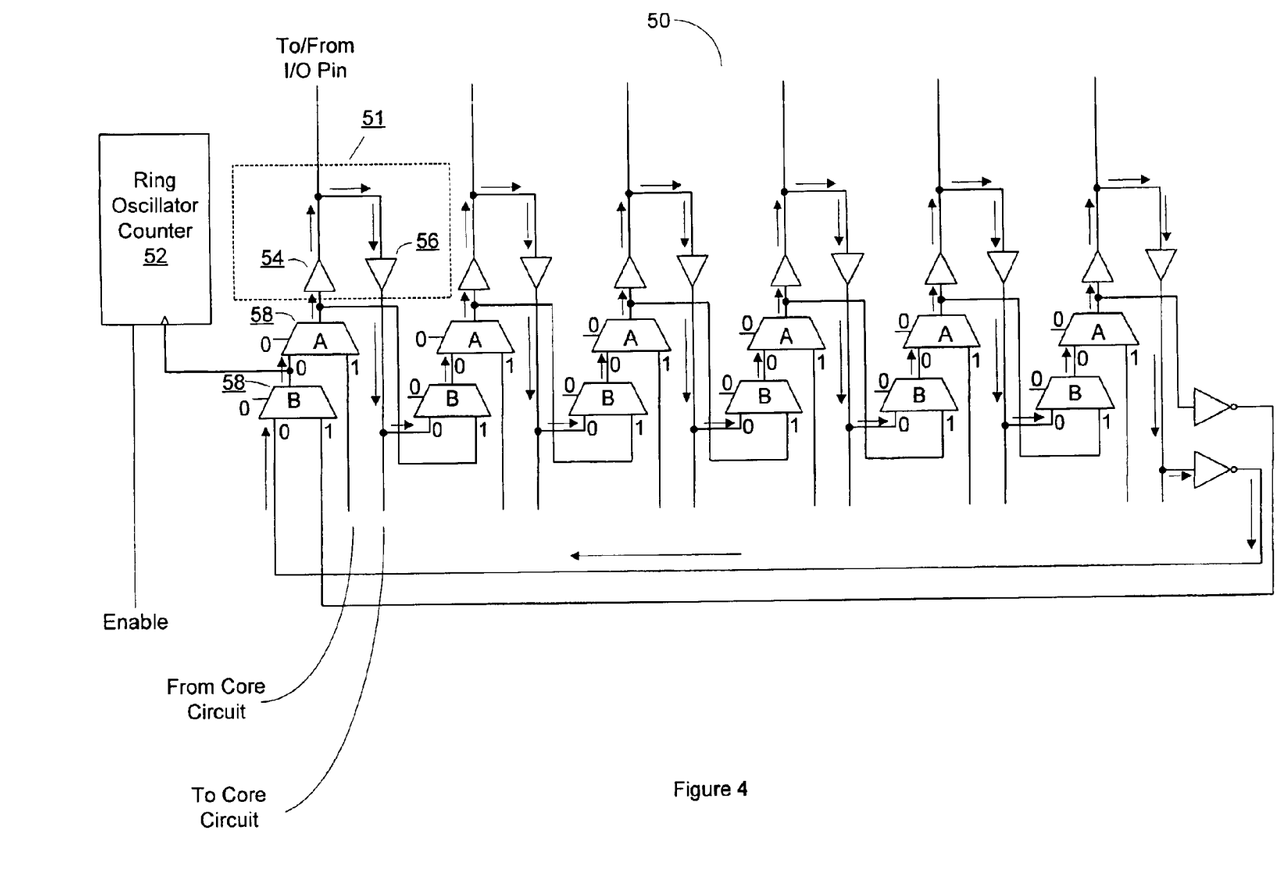
FIG. 4 is a drawing illustrating one possible signal path through one embodiment of a ring oscillator used for I/O timing tests.
Figure 5:
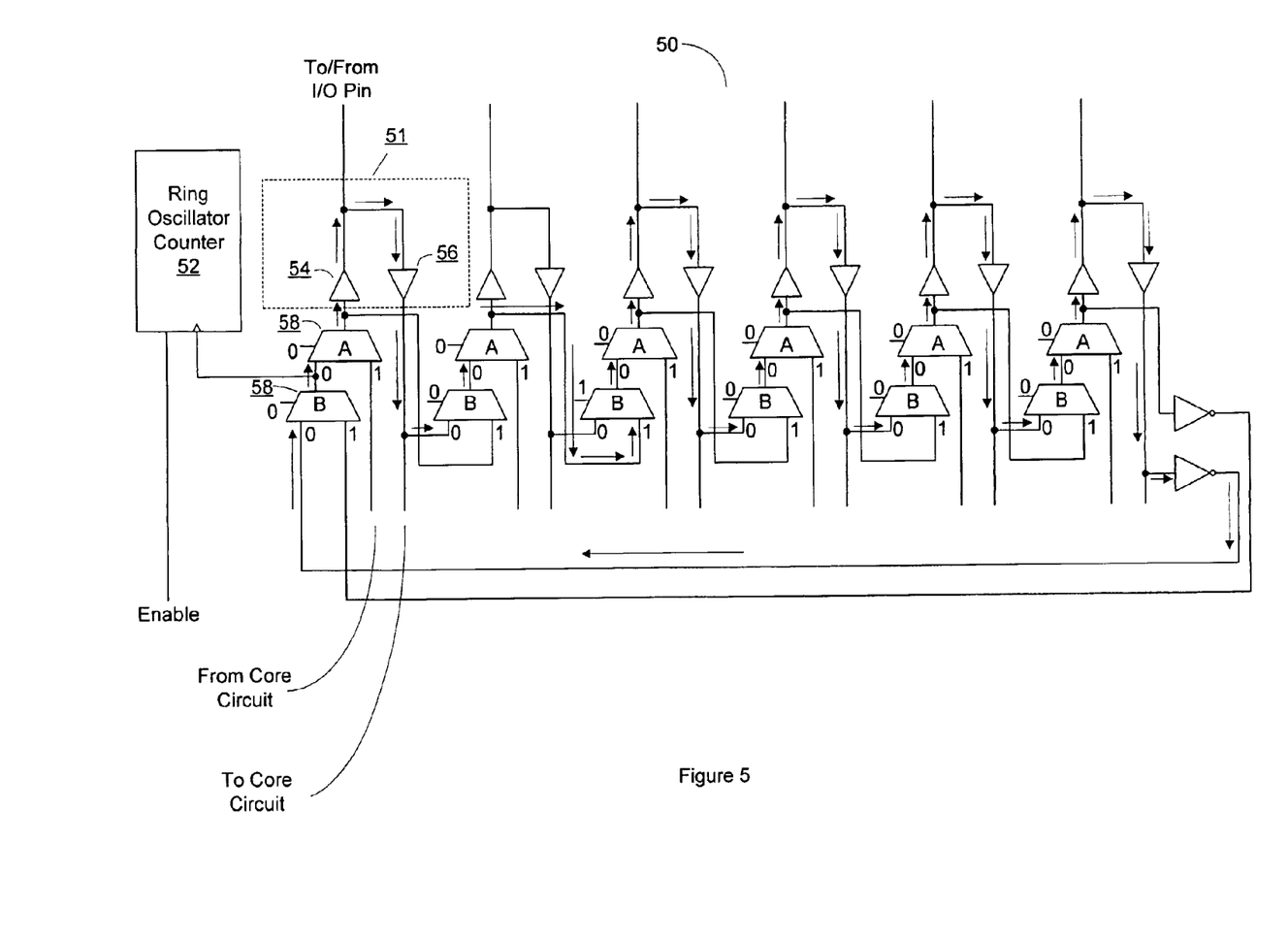
FIG. 5 is another drawing illustrating one possible signal path through one embodiment of a ring oscillator used for I/O timing tests.

FIGS. 4 and 5 will now be used to illustrate the configuring of ring oscillator 50 in order to conduct a BISTT, including the selective enabling and disabling of individual I/O pairs. Turning now to FIG. 4, a drawing illustrating one possible signal path through one embodiment of a ring oscillator used for I/O timing tests is shown. In the embodiment shown, BISTT is enabled for ring oscillator 50 by placing a logic 0 on the selection inputs of each 'A' selection circuit, as well as asserting an enable signal on the enable input to ring oscillator counter 52. Since there is an odd number of inverters for any possible signal path through the ring oscillator, enabling each of the 'A' selection circuits will cause the circuit to start oscillating between logic high and logic low (e.g., logic 1 and logic 0) states.

In this example, a logic 0 is present on the select input of each of the 'B' selection circuits, and thus each of the I/O pairs present in ring oscillator 50 is enabled for conducting a BISTT routine. The arrows shown in the drawing indicate the path for a signal propagating through the ring oscillator. As noted above, the BISTT routine may be conducted by counting the number of pulses received by ring oscillator counter 52 for a predetermined period of time. The average propagation delay for each pair may then be computed by dividing the predetermined time period by the number of pulses counted by ring oscillator counter 52.

FIG. 5 is another drawing illustrating another possible signal path through the embodiment of the ring oscillator shown in FIG. 4. In this particular example, a logic 1 is present on the select input of the third (from the left in the drawing) 'B' selection circuit of ring oscillator 50. As a result of the logic 1 present on the select input of the third 'B' selection circuit, the second I/O pair is effectively disabled from the ring oscillator. The arrows in the drawing show the path of a signal propagating through the ring oscillator. A signal propagating through the ring oscillator will propagate through the third 'B' selection circuit via it's '1' input, effectively skipping the second I/O pair. Logic 1's are present on the select inputs for the remainder of the 'B' selection circuits, and thus the remainder of the I/O pairs are enabled in this particular configuration.

Taken in tandem, FIGS. 4 and 5 illustrate how the ring oscillator can be used to determine the propagation delay through a single I/O pair. A first run of the BISTT routine can be performed with ring oscillator 50 set to the configuration shown in FIG. 4. The total propagation delay time through all of the I/O pairs of the ring oscillator can be determined by dividing the time (i.e. duration) of the first run of the BISTT routine by the 2 times the number of pulses counted by ring oscillator counter 52. Next, a second run of the BISTT routine is performed with the ring oscillator 50 set to the configuration of FIG. 5 (or an equivalent configuration if it is desired to determine the propagation delay time through one of the other I/O pairs). The propagation delay time through the enabled I/O pairs is calculated by dividing the duration of the second BISTT routine by 2 times the number of pulses counted by ring oscillator counter 52. Next, the propagation delay through the single I/O pair (the one that is disabled for the second run of the BISTT routine) may then be determined by computing the difference between the time calculated in the first run of the BISTT routine and the second run of the BISTT routine.

It should be noted that the embodiments of the ring oscillator shown in FIGS. 3, 4, and 5 are illustrative, and other embodiments are possible and contemplated. In particular, ring oscillators may be formed using any number of I/O pairs, and that there is no theoretical limit to the number of I/O pairs that may be present in a given ring oscillator implementation. Furthermore, embodiments where ring oscillators are formed based strictly on input pins or strictly on output pins are also possible and contemplated. With respect to the ring oscillator counter, multiple embodiments are possible and contemplated, such as counters that increment on a rising edge, a falling edge, or both edges.

Figure 6:
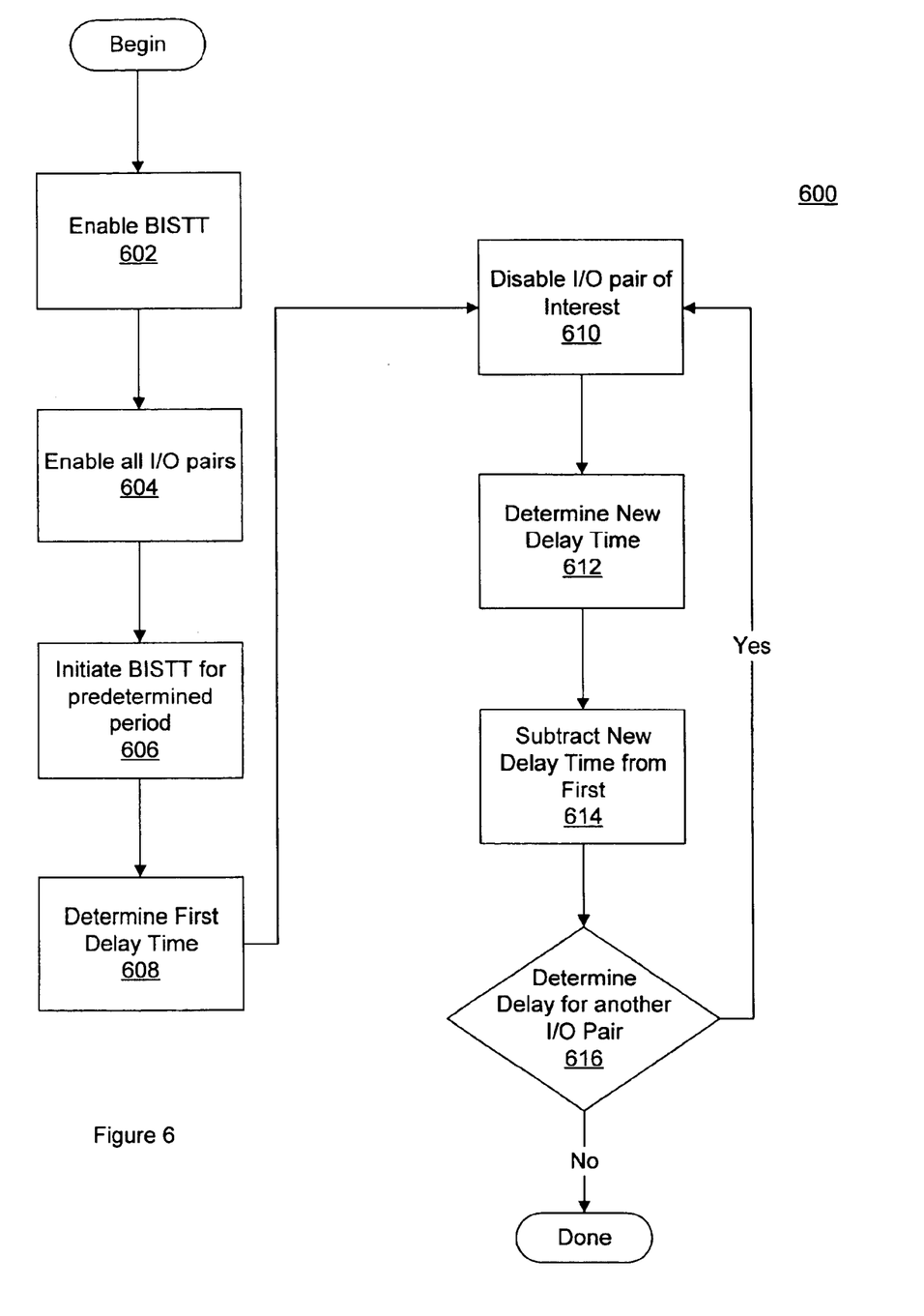
FIG. 6 is a flow diagram for one embodiment of a method for conducting built-in self-timing tests.

FIG. 6 is a flow diagram for one embodiment of a method for conducting built-in self-timing tests. In the embodiment shown, method 600 begins with the enabling of a BISTT routine (602). A BISTT routine can be enabled for the embodiments discussed above in FIGS. 3, 4, and 5 by driving a logic 0 to the select input of each of the 'A' selection circuits, as well as asserting the enable signal for the ring oscillator counter (e.g. ring oscillator counter 52 as described above). After the BISTT routine has been enabled, each of the I/O pairs may be enabled for the BISTT (604). This is accomplished in the embodiments of FIGS. 3, 4, and 5 by driving a logic 0 to the select input of each of the 'B' selection circuits, although embodiments utilizing other logic values are possible and contemplated.

With the BISTT routine and each of the I/O pairs enabled, a first run of the BISTT is initiated (606) to run for a predetermined period of time. After the first BISTT run has completed, a first delay time is calculated (608) by dividing the predetermined time period by 2 times the number of pulses counted by the ring oscillator counter. This yields the average delay time for a pulse to propagate through each of the I/O pairs of the ring oscillator.

In order to determine the delay time for a pulse to propagate through a single I/O pair of interest, the I/O pair may be disabled for a subsequent run of the BISTT (610). In the embodiments of the ring oscillator discussed above (ring oscillator 50), this is performed by driving a logic 1 to the selection input of the appropriate selection circuit (although, as noted, other logic values may be used for this purpose in other embodiments). For example, in FIG. 5, a logic 1 is driven to the selection of the third (from the left) 'B' selection circuit, thereby disabling the second (from the left) I/O pair for the purposes of a BISTT run. Thus, a pulse propagating through the ring oscillator during the BISTT run when a logic 1 is driven to the select input of the third 'B' selection circuit will not propagate through the second I/O pair.

After disabling the I/O pair of interest, a second run of the BISTT is performed and the delay time is determined for this second run (612). Since a pulse will not propagate through the second I/O pair for this BISTT run, the propagation delay for a pulse through the ring oscillator will be less than for a BISTT run when all I/O pairs are enabled. The propagation delay time for the I/O pair of interest may then be determined by subtracting the delay time for the second BISTT run from the delay time for the first BISTT run (614). If it is desired to determine the delay time for another I/O pair (616), the method may return to 610 and repeat the procedure. This may be done for each of the I/O pairs present in the ring oscillator. Another embodiment is possible and contemplated where the method returns to 604 if it is desired to determine the delay time for other individual I/O pairs.

In various embodiments, method 600 is independent of the IC manufacturing process. That is, process variations need not be considered in order to perform the method. As such, no calibration is necessary prior to performance of method 600.

Although the various embodiments of the method and circuit described above have been in conjunction with ATE, embodiments are possible and contemplated wherein ATE is not necessary to perform a BISTT routine. An integrated circuit may be additionally configured to include control circuitry that may allow a BISTT routine to be performed independently of ATE. Such control circuitry may include the use of other existing circuitry. For example, in one embodiment, boundary scan registers may be used to configure a ring oscillator for a BISTT routine, storing information indicating which I/O pairs are to be enabled for a particular run of the BISTT. Other pre-existing circuitry in the integrated circuit may also be used to control the operation of the BISTT, including the initiation of the BISTT as well as the counting of the pulses. In integrated circuits that are configured to execute instructions (e.g. a microprocessor), a combination of pre-existing circuitry and software instructions executed by the integrated circuit may be used to initiate, perform, and provide an output for a BISTT routine. Thus, embodiments are possible and contemplated wherein a BISTT routine for an integrated circuit may be performed on other devices (e.g. a simple test board) without the use of ATE.

Regardless of whether or not ATE is used to perform the BISTT, external connections may be provided to pins that are strictly inputs or strictly outputs in order to form an I/O pair. This is one possible embodiment contemplated for performing a BISTT routine on pins that are not configured for both input and output operations. Another possible embodiment for performing a BISTT includes an integrated circuit wherein all pins are configured as I/O pins, even if such pins are used only for input operations or output operations by their normally defined function.

It should be noted that the arrangement of the selection circuits as well as the logical values necessary to select particular inputs described above are exemplary and are not intended to be limiting. Other selection circuit arrangements and other logical values for selecting a particular input to propagate are possible and contemplated.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. An integrated circuit comprising:
    a plurality of I/O pairs, wherein in each I/O pair includes a driver and a receiver;
    a ring oscillator, wherein the ring oscillator comprises at least a first loop having an odd number of inverters, and wherein the first loop includes the plurality of I/O pairs;
    a plurality of selection circuits, wherein each of the plurality of selection circuits is associated with one of the plurality of I/O pairs, and wherein each of the plurality of selection circuits is configured to selectively enable or disable an associated I/O pair in the first loop;
    a measurement circuit coupled to the loop, wherein the measurement circuit is configured to measure a total delay time in the first loop.

2. The integrated circuit as recited in claim 1 wherein the ring oscillator includes a second loop having an odd number of inverters, and wherein each of the plurality of selection circuits is configured to selectively enable or disable an associated I/O pair from the second loop.

3. The integrated circuit as recited in claim 2, wherein the measurement circuit is further configured to measure total delay time in the second loop.

4. The integrated circuit as recited in claim 3, wherein the measurement circuit is configured to measure total delay time in either the first loop or the second loop by counting a number of pulses received during a predetermined time interval.

5. The integrated circuit as recited in claim 4, wherein the total delay time in either the first loop or the second loop is approximately the predetermined time interval divided by two times the number of pulses.

6. The integrated circuit as recited in claim 5, wherein an individual delay time is determined by dividing the total delay time in either the first loop or the second loop by a number of I/O pairs enabled in either the first loop or the second loop.

7. The integrated circuit as recited in claim 2, wherein the selection circuits are multiplexers.

8. The integrated circuit as recited in claim 7, wherein the selection circuits comprise pairs of multiplexers, wherein each selection circuit includes a first multiplexer and a second multiplexer.

9. The integrated circuit as recited in claim 8, wherein an output of the first multiplexer is coupled to an input of a driver of one of the plurality of I/O pairs, and wherein an input of the second multiplexer is coupled to an output of a receiver of one of the plurality of I/O pairs.

10. The integrated circuit as recited in claim 8, wherein a select input of the first multiplexer and the measurement circuit are coupled to receive an enable signal for enabling a measurement mode.

11. The integrated circuit as recited in claim 8, wherein the second multiplexer is configured to, when a signal at a select input is in a first state, enable its associated I/O pair in either the first or the second ring oscillator loop, and when the signal at the select input is in a second state, remove the associated I/O pair from the either the first or the second ring oscillator loop.

12. A method for conducting timing tests in an integrated circuit, the method comprising:
enabling one or more I/O pairs into a loop of a ring oscillator, wherein each of the one or more I/O pairs includes a driver and a receiver;
initiating operation of the ring oscillator, wherein the ring oscillator includes an odd number of inverters;
measuring a total delay time in the loop of the ring oscillator.

13. The method as recited in claim 12, wherein said measuring is performed by a counter coupled to the loop of the ring oscillator.

14. The method as recited in claim 13, wherein said measuring is performed by the counter counting a number of pulses received from the loop during a predetermined time interval.

15. The method as recited in claim 14, wherein the counter is configured to increment on a rising edge of a pulse.

16. The method as recited in claim 15, wherein the counter is further configured to increment on a falling edge of the pulse.

17. The method as recited in claim 14, wherein the counter is configured to increment on a falling edge of a pulse.

18. The method as recited in claim 14, wherein the total delay time through the loop is calculated by dividing the predetermined time interval divided by two times the number of pulses received.

19. The method as recited in claim 18 further comprising calculating an average individual delay time by dividing the total delay time by the number of enabled I/O pairs, wherein the individual delay time is indicative of a delay time that is an average delay through each of the enabled I/O pairs.

20. The method as recited in claim 14 further comprising measuring a delay time for a single I/O pair, wherein measuring the delay time for a single I/O pair includes:
measuring a delay time for N I/O pairs;
measuring a delay time for N–1 I/O pairs, wherein the single I/O pair is selectively disabled from the ring oscillator loop during said measuring the delay time for the N–1 I/O pairs; and
subtracting the delay time measured for N–1 I/O pairs from the delay time measured for N I/O pairs.

21. The method as recited in claim 13, wherein the integrated circuit includes a plurality of selection circuits, wherein each of the plurality of selection circuits is associated with an I/O pair, and wherein each of the plurality of selection circuits is configured to selectively remove its associated I/O pair from the loop.

22. The method as recited in claim 21, wherein each of the selection circuits comprise multiplexers arranged in pairs including a first multiplexer and a second multiplexer.

23. The method as recited in claim 22, wherein an output of the first multiplexer is coupled to an input of a driver of one of the one or more I/O pairs, and wherein an input of the second multiplexer is coupled to an output of one of a receiver of one of the one or more I/O pairs.

24. The method as recited in claim 22 further comprising the counter and the first multiplexer receiving an enable signal for enabling a measurement mode.

25. The method as recited in claim 22, wherein the second multiplexer is configured to; when a signal at a select input of the second multiplexer is in a first state, enable its associated I/O pair in the loop of the ring oscillator, and when the signal at the select input of the multiplexer is in a second state, remove the associated I/O pair from the loop of the ring oscillator.

26. The method as recited in claim 13, wherein the loop of the ring oscillator is a first loop, and wherein the ring oscillator further includes a second loop.

27. The method as recited in claim 13, wherein the method is independent of a manufacturing process for the integrated circuit.

28. The method as recited in claim 27, wherein the method is performed without a calibration process.

* * * * *